US010587153B2

(12) United States Patent
Tsai et al.

(10) Patent No.: US 10,587,153 B2
(45) Date of Patent: Mar. 10, 2020

(54) INTRUDING METAL DETECTION METHOD FOR INDUCTION TYPE POWER SUPPLY SYSTEM AND RELATED SUPPLYING-END MODULE

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Technology Co., Ltd., New Taipei (TW)

( * ) Notice: Subject to any disclaimer, the term of this patent is extended or adjusted under 35 U.S.C. 154(b) by 0 days.

(21) Appl. No.: 16/120,302

(22) Filed: Sep. 2, 2018

(65) Prior Publication Data
US 2018/0375386 A1 Dec. 27, 2018

Related U.S. Application Data

(63) Continuation-in-part of application No. 15/005,014, filed on Jan. 25, 2016, now Pat. No. 10,114,396, and (Continued)

(30) Foreign Application Priority Data

Feb. 1, 2011 (TW) .............................. 100103836 A
May 3, 2013 (TW) .............................. 102115983 A
(Continued)

(51) Int. Cl.
*H02J 50/12* (2016.01)
*H02J 50/60* (2016.01)
(Continued)

(52) U.S. Cl.
CPC .............. *H02J 50/60* (2016.02); *G06F 1/266* (2013.01); *H02J 50/05* (2016.02); *H02J 50/12* (2016.02);
(Continued)

(58) Field of Classification Search
CPC .. H02J 50/60; H02J 50/80; H02J 50/05; H02J 50/12; H02J 7/025; H02J 50/20; G06F 1/266; G06F 15/00; G01R 33/0283
(Continued)

(56) References Cited

U.S. PATENT DOCUMENTS 3,573,817 A  4/1971 Akers
9,553,485 B2 1/2017 Singh
(Continued)

FOREIGN PATENT DOCUMENTS

CN       101399464 A    4/2009
CN       101834473 A    9/2010
(Continued)

OTHER PUBLICATIONS

Ma et al., Analysis of metal foreign object setting on electric vehicle wireless power transfer system, <Advanced Technology of Electrical Engineering and Energy> vol. 36, No. 2, p. 14-20 , Feb. 28, 2017.

*Primary Examiner* — Ly D Pham
(74) *Attorney, Agent, or Firm* — Winston Hsu

(57) ABSTRACT

The present invention discloses an intruding metal detection method for a supplying-end module of an induction type power supply system having a supplying-end coil controlled by a first driving signal and a second driving signal. The method includes periodically generating a detection signal on the first driving signal and the second driving signal, wherein the detection signal controls the supplying-end coil to resonate and generate a coil signal; setting at least one threshold voltage and comparing a plurality of peak values of the coil signal with the at least one threshold voltage, respectively, to generate a plurality of trigger signals; determining whether to perform a pre-charging procedure according to a resonant frequency of the coil signal; and determining whether there is an intruding metal existing in a power
(Continued)

US 10,587,153 B2
Page 2 supply range of the induction type power supply system according to the plurality of trigger signals and the resonant frequency.

22 Claims, 8 Drawing Sheets

Related U.S. Application Data a continuation-in-part of application No. 15/231,795, filed on Aug. 9, 2016, now Pat. No. 10,289,142, which is a continuation-in-part of application No. 15/005,014, filed on Jan. 25, 2016, now Pat. No. 10,114,396, and a continuation-in-part of application No. 15/197,796, filed on Jun. 30, 2016, now Pat. No. 10,312,748, which is a continuation-in-part of application No. 14/822,875, filed on Aug. 10, 2015, now Pat. No. 9,960,639, and a continuation-in-part of application No. 14/731,421, filed on Jun. 5, 2015, now Pat. No. 10,038,338, which is a continuation-in-part of application No. 13/541,090, filed on Jul. 3, 2012, now Pat. No. 9,075,587, and a continuation-in-part of application No. 14/017,321, filed on Sep. 4, 2013, now Pat. No. 9,628,147, which is a continuation-in-part of application No. 13/212,564, filed on Aug. 18, 2011, now Pat. No. 8,941,267, which is a continuation-in-part of application No. 13/154,965, filed on Jun. 7, 2011, now Pat. No. 8,810,072, said application No. 14/017,321 is a continuation-in-part of application No. 13/541,090, filed on Jul. 3, 2012, now Pat. No. 9,075,587, said application No. 15/197,796 is a continuation-in-part of application No. 14/876,788, filed on Oct. 6, 2015, now Pat. No. 9,831,687, which is a continuation-in-part of application No. 14/017,321, filed on Sep. 4, 2013, now Pat. No. 9,628,147.

(30) Foreign Application Priority Data

| | | | |
|---|---|---|---|
| Jan. 14, 2015 | (TW) | ............... | 104101227 A |
| Jun. 2, 2015 | (TW) | ............... | 104117722 A |
| Jun. 30, 2015 | (TW) | ............... | 104121025 A |
| Oct. 28, 2015 | (TW) | ............... | 104135327 A |
| Apr. 14, 2016 | (TW) | ............... | 105111620 A |
| May 13, 2016 | (TW) | ............... | 105114827 A |
| Apr. 18, 2018 | (TW) | ............... | 107113176 A |

(51) Int. Cl.

| | |
|---|---|
| *H02J 50/80* | (2016.01) |
| *G06F 15/00* | (2006.01) |
| *G06F 1/26* | (2006.01) |
| *H02J 50/05* | (2016.01) |
| *H02J 7/02* | (2016.01) |
| *G01R 33/028* | (2006.01) |

(52) U.S. Cl.

CPC .......... *H02J 50/80* (2016.02); *G01R 33/0283* (2013.01); *G06F 15/00* (2013.01); *H02J 7/025* (2013.01)

(58) Field of Classification Search

USPC .............. 700/292; 702/189, 57, 64; 324/713
See application file for complete search history.

(56) References Cited

U.S. PATENT DOCUMENTS

| | | | |
|---|---|---|---|
| 9,995,777 B2 | 6/2018 | Von Novak, III | |
| 10,056,944 B2 | 8/2018 | Tsai | |
| 10,122,220 B2 | 11/2018 | Sankar | |
| 2005/0258826 A1 | 11/2005 | Kano | |
| 2008/0106273 A1* | 5/2008 | Bauer | G01R 33/0283 324/656 |
| 2009/0167300 A1* | 7/2009 | Cech | B60R 21/0134 324/239 |
| 2009/0278651 A1* | 11/2009 | Okada | H01F 27/402 336/200 |
| 2009/0319212 A1* | 12/2009 | Cech | B60R 21/0136 702/65 |
| 2010/0098177 A1 | 4/2010 | Hamaguchi | |
| 2010/0213590 A1* | 8/2010 | Warren | H01L 23/576 257/678 |
| 2010/0225173 A1 | 9/2010 | Aoyama | |
| 2011/0062793 A1 | 3/2011 | Azancot | |
| 2011/0097996 A1 | 4/2011 | Kalanithi | |
| 2012/0169132 A1 | 7/2012 | Choudhary | |
| 2013/0057079 A1 | 3/2013 | Park | |
| 2013/0065518 A1 | 3/2013 | Byun | |
| 2013/0082653 A1 | 4/2013 | Lee | |
| 2013/0106197 A1 | 5/2013 | Bae | |
| 2014/0015329 A1 | 1/2014 | Widmer | |
| 2015/0180286 A1 | 6/2015 | Asanuma | |
| 2015/0372493 A1 | 12/2015 | Sankar | |
| 2016/0064951 A1 | 3/2016 | Yamamoto | |
| 2016/0064952 A1 | 3/2016 | Matsumoto | |
| 2016/0072336 A1 | 3/2016 | Tamino | |
| 2018/0034281 A1 | 2/2018 | Tsai | |
| 2018/0138756 A1 | 5/2018 | Bae | |
| 2018/0241257 A1 | 8/2018 | Muratov | |

FOREIGN PATENT DOCUMENTS

| | | |
|---|---|---|
| CN | 101924399 A | 12/2010 |
| CN | 102055250 A | 5/2011 |
| CN | 102157991 A | 8/2011 |
| CN | 104160300 A | 11/2014 |
| CN | 204190475 U | 3/2015 |
| CN | 105308829 A | 2/2016 |
| CN | 106094041 A | 11/2016 |
| CN | 106134037 A | 11/2016 |
| CN | 106560730 A | 4/2017 |
| CN | 106685029 A | 5/2017 |
| CN | 107615612 A | 1/2018 |
| EP | 3 160 008 A1 | 4/2017 |
| JP | 2016-75484 A | 5/2016 |
| TW | 201315082 A1 | 4/2013 |
| TW | 201417445 A | 5/2014 |
| TW | 201513523 A | 4/2015 |
| TW | 201605143 A | 2/2016 |
| WO | 2016/159788 A1 | 10/2016 |
| WO | 2016/181658 A1 | 11/2016 |

\* cited by examiner

INTRUDING METAL DETECTION METHOD FOR INDUCTION TYPE POWER SUPPLY SYSTEM AND RELATED SUPPLYING-END MODULE

CROSS REFERENCE TO RELATED APPLICATIONS

This application is a continuation-in-part application of U.S. application Ser. No. 15/005,014, filed on Jan. 25, 2016, and a continuation-in-part application of U.S. application Ser. No. 15/231,795, filed on Aug. 9, 2016.

U.S. application Ser. No. 15/231,795 is further a continuation-in-part application of U.S. application Ser. No. 15/005,014, filed on Jan. 25, 2016, and a continuation-in-part application of U.S. application Ser. No. 15/197,796, filed on Jun. 30, 2016.

U.S. application Ser. No. 15/197,796 is further a continuation-in-part application of U.S. application Ser. No. 14/822,875, filed on Aug. 10, 2015, a continuation-in-part application of U.S. application Ser. No. 14/731,421, filed on Jun. 5, 2015, and a continuation-in-part application of U.S. application Ser. No. 14/876,788, filed on Oct. 6, 2015.

U.S. application Ser. No. 14/731,421 is further a continuation-in-part application of U.S. application Ser. No. 14/017,321, filed on Sep. 4, 2013, and a continuation-in-part application of U.S. application Ser. No. 13/541,090, filed on Jul. 3, 2012.

U.S. application Ser. No. 14/017,321 is further a continuation-in-part application of U.S. application Ser. No. 13/541,090, filed on Jul. 3, 2012, and a continuation-in-part application of U.S. application Ser. No. 13/212,564, filed on Aug. 18, 2011.

U.S. application Ser. No. 13/212,564 is further a continuation-in-part application of U.S. application Ser. No. 13/154,965, filed on Jun. 7, 2011.

U.S. application Ser. No. 14/876,788 is further a continuation-in-part application of U.S. application Ser. No. 14/017,321, filed on Sep. 4, 2013.

The contents of these applications are incorporated herein by reference.

BACKGROUND OF THE INVENTION

1. Field of the Invention

The present invention relates to an intruding metal detection method for an induction type power supply system, and more particularly, to a method of determining the existence of an intruding metal before power delivery of an induction type power supply system starts.

2. Description of the Prior Art

In an induction type power supply system, a power supply device applies a driver circuit to drive a supplying-end coil to generate resonance, in order to send electromagnetic waves. A coil of the power receiving device may receive the electromagnetic waves and perform power conversion to generate DC power to be supplied for the device in the power receiving end. If the electromagnetic energy sent by the supplying-end coil is exerted on a metal, it may heat the metal. The accumulated heat energies may cause high temperature on the metal, which may burn surrounding objects and thus generate damages. In the prior art, in an induction type power supply system, driving operation in the power delivery process may be periodically interrupted to detect the intruding metal. If an intruding metal is found, the system may stop sending electric power. After a period of time, the system may restart to send electric power. Subsequently, the electric power is sent for a period of time, and if an intruding metal is detected, the system may stop sending electric power again. In such a manner, the iteration may still heat the metal object, and it is dangerous after the heating operations last for a long period.

Thus, there is a need to provide another intruding metal detection method which is capable of performing determination before the induction type power supply system starts to send power, and thus power delivery operation may not be activated when an intruding metal is found, in order to realize a more effective mechanism of intruding metal protection.

SUMMARY OF THE INVENTION

It is therefore an objective of the present invention to provide a method of determining whether there is an existing intruding metal before the induction type power supply system starts to send electric power, in order to enhance the metal protection effects for the induction type power supply system.

An embodiment of the present invention discloses an intruding metal detection method for a supplying-end module of an induction type power supply system. The supplying-end module comprises a supplying-end coil controlled by a first driving signal and a second driving signal. The intruding metal detection method comprises: periodically generating a detection signal on the first driving signal and the second driving signal, wherein the detection signal controls the supplying-end coil to resonate and generate a coil signal; setting at least one threshold voltage and comparing a plurality of peak values of the coil signal with the at least one threshold voltage, respectively, to generate a plurality of trigger signals; determining whether to perform a pre-charging procedure according to a resonant frequency of the coil signal; and determining whether there is an intruding metal existing in a power supply range of the induction type power supply system according to the plurality of trigger signals and the resonant frequency.

Another embodiment of the present invention discloses a supplying-end module for an induction type power supply system, for performing an intruding metal detection method. The supplying-end module comprises a supplying-end coil, a power driver, a signal receiver and a processor. The power driver, coupled to the supplying-end coil, is used for outputting a first driving signal and a second driving signal to the supplying-end coil, and periodically generating a detection signal on the first driving signal and the second driving signal, wherein the detection signal controls the supplying-end coil to resonate and generate a coil signal. The signal receiver, coupled to the supplying-end coil, is used for setting at least one threshold voltage and comparing a plurality of peak values of the coil signal with the at least one threshold voltage, respectively, to generate a plurality of trigger signals. The processor, coupled to the signal receiver, is used for performing the following steps: determining whether to perform a pre-charging procedure according to a resonant frequency of the coil signal; and determining whether there is an intruding metal existing in a power supply range of the induction type power supply system according to the plurality of trigger signals and the resonant frequency.

These and other objectives of the present invention will no doubt become obvious to those of ordinary skill in the art

DETAILED DESCRIPTION

Figure 1:
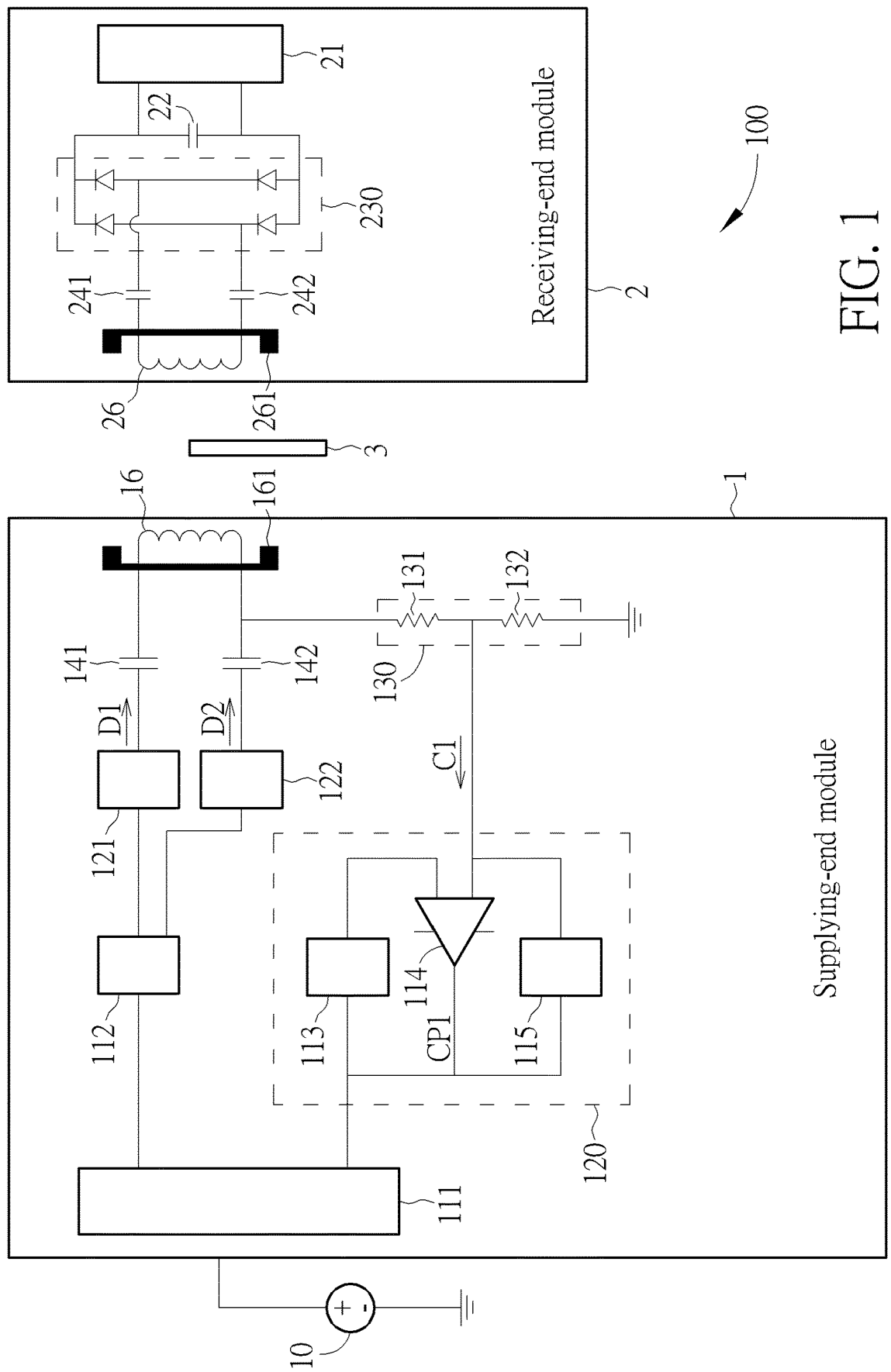
FIG. 1 is a schematic diagram of an induction type power supply system according to an embodiment of the present invention.

Please refer to FIG. 1, which is a schematic diagram of an induction type power supply system 100 according to an embodiment of the present invention. As shown in FIG. 1, the induction type power supply system 100 includes a supplying-end module 1 and a receiving-end module 2. The supplying-end module 1 receives power from a power supply device 10 and outputs wireless power to the receiving-end module 2. The supplying-end module 1 includes a supplying-end coil 16 and resonant capacitors 141 and 142, disposed as a C-L-C structure. The supplying-end coil 16 is used for delivering electromagnetic energies to the receiving-end module 2 to supply power. The resonant capacitors 141 and 142, coupled to the two terminals of the supplying-end coil 16, respectively, is used for performing resonance together with the supplying-end coil 16 during power supply. In addition, in the supplying-end module 1, a magnetic conductor 161 composed of magnetic materials may be selectively disposed, to enhance the electromagnetic induction capability of the supplying-end coil 16 and also prevent electromagnetic energies from affecting the objects located in the non-inducting side of the coil.

In order to control the operations of the supplying-end coil 16 and the resonant capacitors 141 and 142, the supplying-end module 1 further includes a processor 111, a clock generator 112, power driver units 121 and 122, a signal receiver 120 and a voltage dividing circuit 130. The power driver units 121 and 122, coupled to the supplying-end coil 16 and the resonant capacitors 141 and 142, are used for sending driving signals D1 and D2 to the supplying-end coil 16, respectively. The power driver units 121 and 122 may be controlled by the processor 111, for driving the supplying-end coil 16 to generate and send power. The clock generator 112, coupled to the power driver units 121 and 122, is used for controlling the power driver units 121 and 122 to send the driving signals D1 and D2. The clock generator 112 may be a pulse width modulation (PWM) generator or other type of clock generator, which may output a clock signal to the power driver units 121 and 122. The processor 111 may receive information related to a coil signal C1 (i.e., the voltage signal between the supplying-end coil 16 and the resonant capacitor 142) from the supplying-end coil 16, such as the resonant frequency or attenuation degree of the coil signal C1, and determine whether there is an intruding metal accordingly. The processor 111 may be a central processing unit (CPU), a microprocessor, a micro controller unit (MCU), or other type of processing device or computation device. The signal receiver 120 is used for tracking the resonant frequency and the peak values of the coil signal C1, and providing information related to the resonant frequency or the peak values for the processor 111 for follow-up interpretation. The voltage dividing circuit 130, which includes voltage dividing resistors 131 and 132, may attenuate the coil signal C1 on the supplying-end coil 16 and then output the coil signal C1 to the processor 111 and the signal receiver 120. In some embodiments, if the tolerance voltage of the circuits such as the processor 111 and the signal receiver 120 is high enough, the voltage dividing circuit 130 may not be included and the processor 111 and the signal receiver 120 may directly receive the coil signal C1 from the supplying-end coil 16. Other possible components or modules such as a power supply unit and display unit may be included or not according to system requirements. These components are omitted herein without affecting the illustrations of the present embodiments.

In an embodiment, the signal receiver 120 includes a voltage generator 113, a comparator 114 and a voltage detector 115, as shown in FIG. 1. The voltage detector 115 is configured to detect the peak voltages of the coil signal C1 and forward the received voltage information to the processor 111. The voltage detector 115 may be an analog to digital converter (ADC), for converting the analog voltages on the supplying-end coil 16 into digital voltage information and outputting the voltage information to the processor 111. The processor 111 then sets the threshold voltage(s) for determination of intruding metal according to the above voltage information, and outputs the information of the threshold voltage(s) to the voltage generator 113. The voltage generator 113 may be a digital to analog converter, which may receive the information of the threshold voltage (s) from the processor 111, and convert it into analog voltages and then output the analog voltages. An input terminal of the comparator 114 may receive a threshold voltage, and another input terminal of the comparator 114 may receive the coil signal C1 from the supplying-end coil 16, so as to compare the coil signal C1 with the threshold voltage. The processor 111 then determines whether an intruding metal exists according to the above comparison result. Note that the signal receiver 120 may also be integrated in the processor 111, and the implementation is not limited herein.

Please keep referring to FIG. 1. The receiving-end module 2 includes a load unit 21, a capacitor 22, a rectification circuit 230, a receiving-end coil 26 and resonant capacitors 241 and 242. In the receiving-end module 2, a magnetic conductor 261 composed of magnetic materials may also be selectively disposed, to enhance the electromagnetic induction capability of the receiving-end coil 26 and also prevent electromagnetic energies from affecting the back-end circuits. The receiving-end coil 26 may receive electric power from the supplying-end coil 16 and send the received power to the rectification circuit 230 for rectification. After the rectification is accomplished, the power is transmitted to the capacitor 22 and the load unit 21 at the back end. The capacitor 22 may be a filter capacitor for performing filtering, a regulating capacitor for stabilizing the output voltage, or their combinations; this should not be limited herein. In the receiving-end module 2, other possible components or modules such as a feedback circuit and receiving-end microprocessor may be included or not according to system requirements. These components are omitted herein without affecting the illustrations of the present embodiments.

In addition, an intruding metal 3 is not included in the induction type power supply system 100, but is illustrated between the supplying-end module 1 and the receiving-end module 2 in FIG. 1 to facilitate the description. When the intruding metal 3 is located in a power supply range of the induction type power supply system 100, the intruding metal 3 may receive electromagnetic energies sent by the supplying-end module 1 and thus be heated. The intruding metal detection method of the present invention is configured to determine whether there is an intruding metal 3 existing in the power supply range of the induction type power supply system 100, and activate the power delivery operation when confirming that no intruding metal 3 exists.

Figure 2:
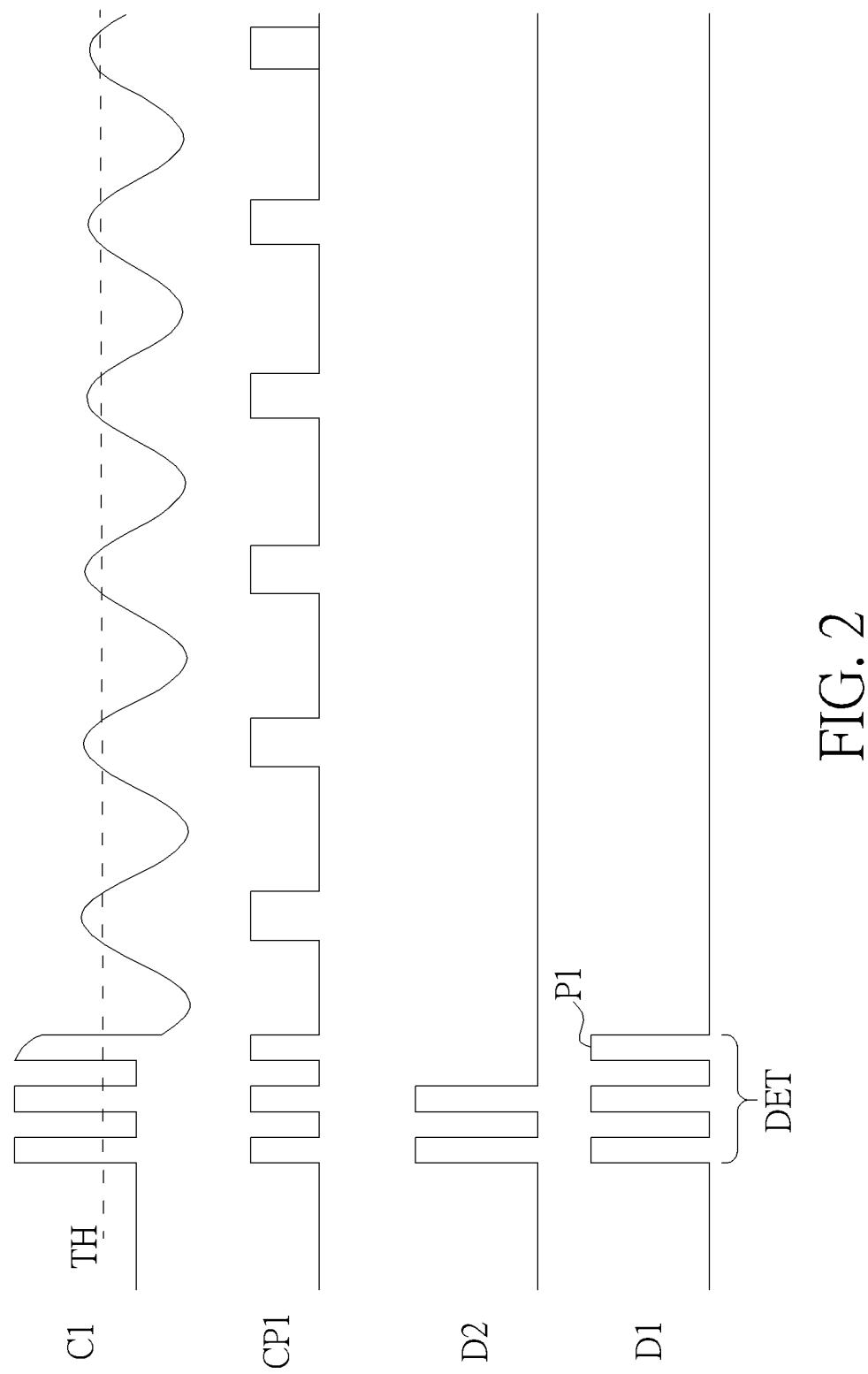
FIG. 2 is a schematic diagram of a detection signal according to an embodiment of the present invention.

The intruding metal detection method of the present invention is realized before the induction type power supply system starts to send electric power, in order to prohibit power delivery when an intruding metal is found. First of all, the supplying-end module 1 of the induction type power supply system 100 may send a detection signal for detecting the intruding metal 3. In detail, the power driver units 121 and 122 may generate a pulse on the driving signals D1 and D2 outputted to the supplying-end coil 16 as a detection signal. The detection signal may control the supplying-end coil 16 to resonate and generate the coil signal C1. Please refer to FIG. 2, which is a schematic diagram of a detection signal DET according to an embodiment of the present invention. FIG. 2 illustrates the waveforms of the driving signals D1 and D2 and the coil signal C1. The power driver units 121 and 122 may control the driving signals D1 and D2 to be simultaneously switched between a high voltage level and a low voltage level twice. Afterwards, when the driving signal D2 is in the low voltage level, only the power driver unit 121 controls the driving signal D1 to be switched to the high voltage level and then return to the low voltage level to form a pulse signal P1, allowing the supplying-end coil 16 to resonate according to the pulse signal P1.

In detail, the step of only controlling the driving signal D1 to generate the pulse signal P1 may apply different voltages to the two terminals of the supplying-end coil 16, and the voltage difference drives the supplying-end coil 16 to resonate. The operations of controlling the driving signals D1 and D2 to be simultaneously switched between the high voltage level and the low voltage level twice in advance aims at pre-charging the bootstrap capacitor in the power driver units 121 and 122. In general, the bootstrap capacitor is used for driving the power driver units 121 and 122 to output a high voltage which is capable of driving the supplying-end coil 16 to operate, and this bootstrap capacitor needs to be charged while the power driver units 121 and 122 output driving signals. After the power driver units 121 and 122 stop operating for a long time, the charges stored in the bootstrap capacitor may gradually be lost. If the bootstrap capacitor performs a driving operation in the situation where the stored charge is insufficient, the pulse signal P1 may not effectively drive the supplying-end coil 16 to reach a higher enough voltage. Therefore, the operation of simultaneously driving the driving signals D1 and D2 may allow the bootstrap capacitor to store enough charges in advance, and then only one of the driving signals D1 and D2 is driven to control the supplying-end coil 16 to resonate. Note that the above method of controlling the driving signals D1 and D2 to be simultaneously switched twice is one of various implementations of the present invention. Those skilled in the art should understand that the driving signals D1 and D2 may be controlled to be simultaneously switched by more than three times or only once before the pulse signal P1 is outputted.

After the power driver units 121 and 122 output the detection signal DET, the supplying-end coil 16 may start to perform self-resonance with continuous attenuation. The processor 111 may perform determination on the intruding metal 3 according to the attenuation manner of the coil signal C1. For example, the processor 111 may control the signal receiver 120 to set at least one threshold voltage or may transmit at least one threshold voltage to the signal receiver 120, so that multiple peak values generated with oscillation of the coil signal C1 may be compared with the at least one threshold voltage, respectively, in order to generate a plurality of trigger signals. As shown in FIG. 2, the waveform of a comparison result CP1 outputted by the comparator 114 is also illustrated. The signal receiver 120 may set a threshold voltage TH, and the voltage generator 113 outputs the threshold voltage TH. The comparator 114 compares the peak values of the coil signal C1 with the threshold voltage TH to obtain the comparison result CP1 including the plurality of trigger signals.

Figure 3:
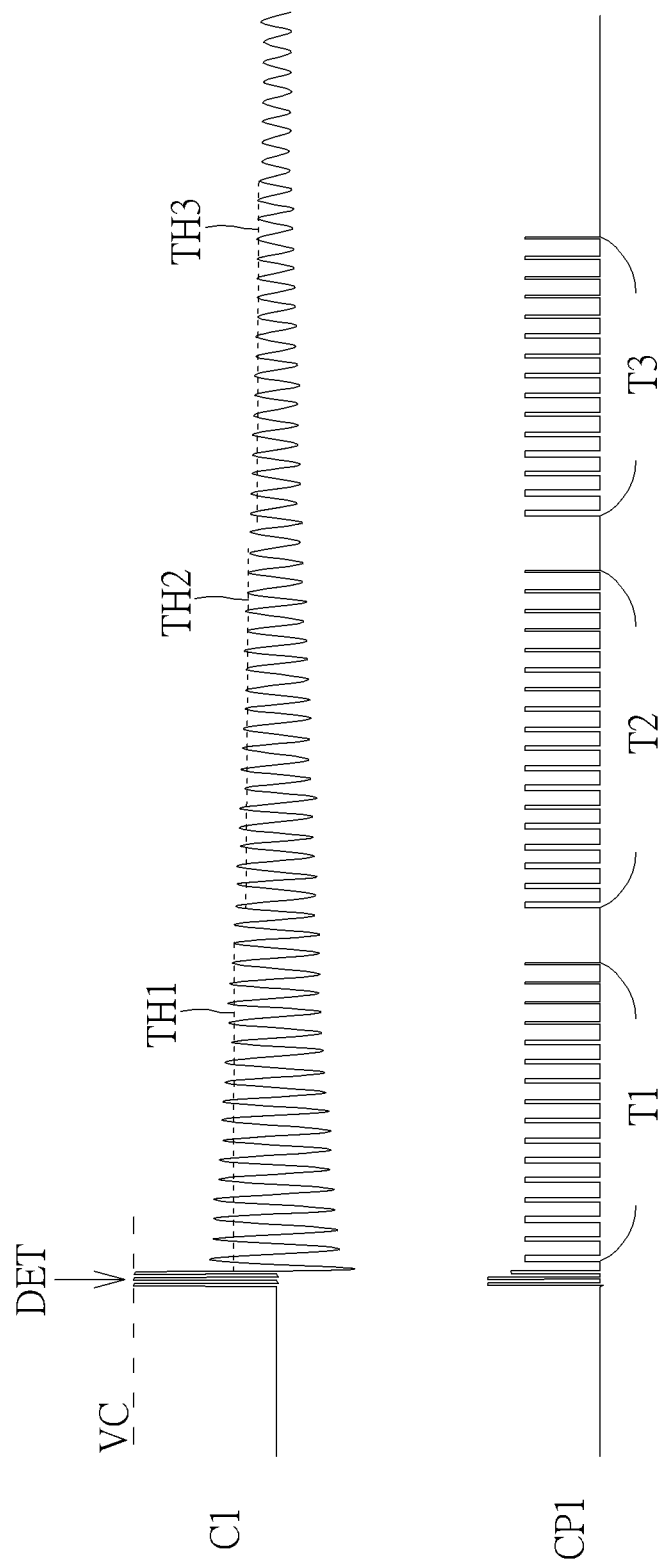
FIG. 3 is a schematic diagram of comparing the peak values of the coil signal with the threshold voltage to generate the trigger signals according to an embodiment of the present invention.

In detail, please refer to FIG. 3, which is a schematic diagram of comparing the peak values of the coil signal C1 with the threshold voltage to generate the trigger signals according to an embodiment of the present invention. FIG. 3 illustrates the waveforms of the coil signal C1 and the comparison result CP1. As shown in FIG. 3, after the detection signal DET is received, the coil signal C1 starts to oscillate and attenuate.

The processor 111 or the signal receiver 120 may set a first threshold voltage TH1, a second threshold voltage TH2 and a third threshold voltage TH3, respectively. First of all, the voltage generator 113 outputs the first threshold voltage TH1, the comparator 114 compares the peak values of the coil signal C1 with the first threshold voltage TH1, to generate first trigger signals T1 on the comparison result CP1. Since the coil signal C1 is attenuating, the peak values of the coil signal C1 keep falling. When a peak value falls below the first threshold voltage TH1, the first trigger signals T1 stop emerging. At this moment, the voltage generator 113 outputs the second threshold voltage TH2 instead of the first threshold voltage TH1, where the second threshold voltage TH2 is smaller than the first threshold voltage TH1. The comparator 114 compares the peak values of the coil signal C1 with the second threshold voltage TH2, to generate second trigger signals T2 on the comparison result CP1. When a peak value is attenuated and falls below the second threshold voltage TH2, the second trigger signals T2 stop emerging. At this moment, the voltage generator 113 outputs the third threshold voltage TH3 instead of the second threshold voltage TH2, in order to generate third trigger signals T3 on the comparison result CP1, where the third threshold voltage TH3 is smaller than the second threshold voltage TH2. When a peak value falls below the third threshold voltage TH3, the third trigger signals T3 stop emerging.

In an embodiment, the signal receiver 120 may obtain a high voltage level reached by the coil signal C1 as a reference voltage VC when the power driver units 121 and 122 generate and output the detection signal DET. The reference voltage VC is multiplied by at least one ratio, respectively, to generate at least one threshold voltage. For example, the voltage detector 115 in the signal receiver 120 may detect the reference voltage VC on the coil signal C1 and multiply the reference voltage VC by a first ratio, a second ratio and a third ratio, respectively, to generate the first threshold voltage TH1, the second threshold voltage TH2 and the third threshold voltage TH3, respectively. The first ratio, the second ratio and the third ratio may be one quarter, one eighth and one sixteenth, respectively. In general, when the supplying-end coil 16 is driven by the detection signal DET and starts to self-resonate, the maximum peak voltage of the coil signal C1 may be approximately one half of the reference voltage VC. The peak value then starts to attenuate and the attenuation degree falls with the magnitude of the peak value. Therefore, the first threshold voltage TH1 may be set to equal one quarter of the reference voltage VC, to obtain the time length the peak value of the coil signal C1 attenuates by half.

As can be seen, the threshold voltages for being compared with the coil signal C1 is based on the high voltage level of the coil signal C1 when the supplying-end coil 16 is driven (i.e., the reference voltage VC), and the high voltage level is multiplied by specific ratios to generate the threshold voltages. Therefore, no matter how the driving signal varies, the time lengths of the first trigger signals T1, the second trigger signals T2 and/or the third trigger signals T3 finally obtained may not change without an existing intruding metal 3. In such a condition, the intruding metal detection method of the present invention may be feasible in any environments; i.e., applicable to different amplitudes of output driving signals. In addition, the influence on attenuation of the coil signal C1 and the influence on the reference voltage VC resulted from the coil characteristics may be canceled proportionally. In comparison, the conventional induction type power supply system always determines an intruding metal by using the attenuation slope of the coil signal, and it is harder to appropriately adjust the determination basis of slope to be adapted to different magnitudes of driving signals.

Figure 4:
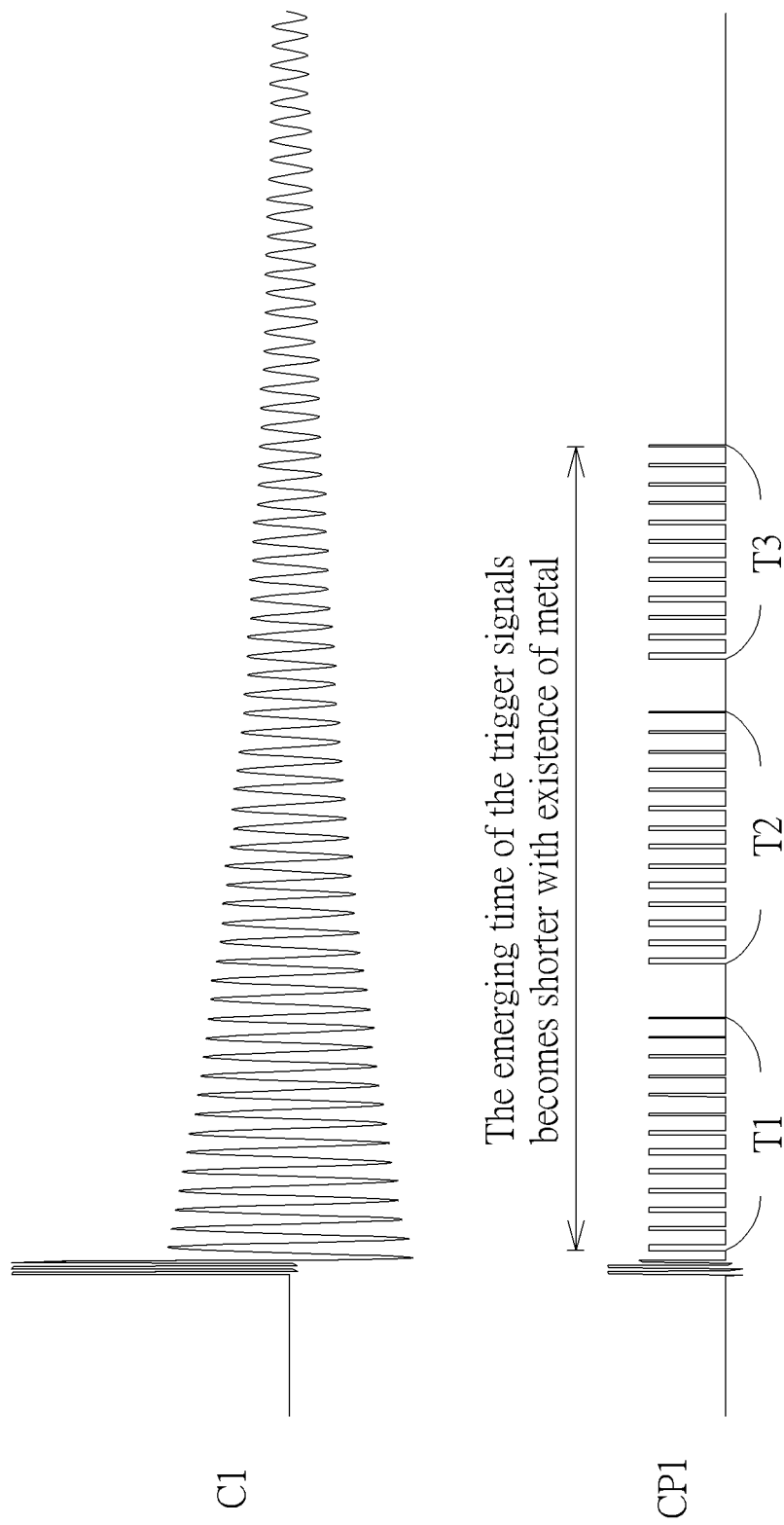
FIG. 4 is a schematic diagram of shorter time length of the trigger signals with existence of the intruding metal.

On the other hand, with existence of the intruding metal 3, the intruding metal 3 may absorb the electromagnetic energies sent by the supplying-end coil 16, which accelerates the attenuation speed of the coil signal C1; hence, the emerging time of the first trigger signals T1, the second trigger signals T2 and/or the third trigger signals T3 may become shorter, as shown in FIG. 4. Preferably, the processor 111 may calculate the entire time length of emergences of the first trigger signals T1, the second trigger signals T2 and the third trigger signals T3 on the comparison result CP1, and compare the time length with a predefined time value. If the time length is greater than the predefined time value, the processor 111 determines that there is no intruding metal 3 existing in the power supply range of the induction type power supply system 100. If the time length is smaller than the predefined time value, the processor 111 determines that there may be an intruding metal 3 existing in the power supply range of the induction type power supply system 100. The predefined time value may be set in advance. For example, a user performs a large number of tests on several tested induction type power supply system, to obtain the time lengths of the trigger signals without existence of any intruding metal and the time lengths of the trigger signals with existence of different types of intruding metals. The user then obtains an optimal value between the time lengths obtained above as a predefined time value. In an embodiment, the number of the first trigger signals T1, the second trigger signals T2 and/or the third trigger signals T3 may be considered as a basis for determining the intruding metal 3.

In general, when the intruding metal 3 exists, the time length or the number of any of the first trigger signals T1, the second trigger signals T2 and the third trigger signals T3 may be smaller than the situation where no intruding metal exists. When the induction type power supply system 100 determines that there is an intruding metal 3, power delivery may not be activated.

Figure 5:
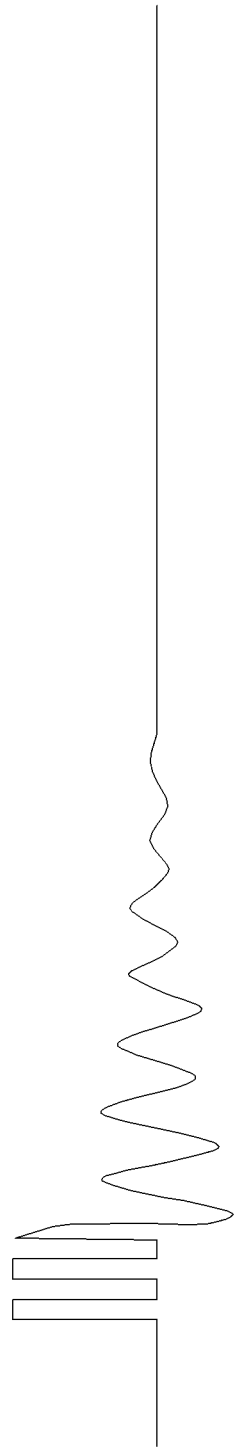
FIG. 5 is a schematic diagram of a malfunctioned receiving-end module causing that the coil signal attenuates with irregular jitters.

In another embodiment, the intruding metal 3 may be determined based on the time length of only one or two of the first trigger signals T1, the second trigger signals T2 and the third trigger signals T3. Note that the above determination method using three sections of trigger signals may also be utilized for determining whether the induction type power supply system 100 operates normally, e.g., determining whether the receiving-end module 2 is malfunctioned or any problem happens. For example, when the rectification circuit 230 of the receiving-end module 2 is malfunctioned in an unsymmetrical manner, the receiving-end module 2 approaching the supplying-end module 1 may cause that the coil signal C1 attenuates with irregular jitters, as the waveform shown in FIG. 5. In such a condition, the processor 111 may determine a wrong resonant frequency more easily, and the trigger signals generated based on only one threshold voltage may not effectively realize metal detection. Similarly, when the induction type power supply system 100 determines that the receiving-end module 2 is malfunctioned, the induction type power supply system 100 may not activate power delivery. In another embodiment, more threshold voltages may set to obtain more sections of trigger signals to perform the determination.

As mentioned above, when the supplying-end coil 16 is driven by the detection signal DET and starts to resonate, the maximum peak voltage of the coil signal C1 approximately equals a half of the reference voltage VC, and the attenuation degree of the coil signal C1 gradually falls with the magnitude of the peak values. Therefore, as for the peak value of the coil signal C1, the time period for falling to one quarter of the reference voltage VC from one half of the reference voltage VC is substantially equal to the time period for falling to one eighth of the reference voltage VC from one quarter of the reference voltage VC, and also substantially equal to the time period for falling to one sixteenth of the reference voltage VC from one eighth of the reference voltage VC. In other words, if the coil signal C1 attenuates normally (i.e., without malfunctions), the emerging time length of each of the first trigger signals T1, the second trigger signals T2 and the third trigger signals T3 may be substantially equal, no matter whether there is an existing intruding metal 3. In such a condition, the processor 111 may determine whether the induction type power supply system 100 or the receiving-end module 2 operates normally accordingly. For example, malfunction may be determined when the processor 111 detects that any one of the time lengths of the first trigger signals T1, the second trigger signals T2 and the third trigger signals T3 is too long or too short.

Please note that the receiving-end module 2 includes the capacitor 22 having larger capacitance. Before the charging operation starts, the capacitor 22 has not started to receive and store electric charges yet. When the receiving-end module 2 approaches the supplying-end module 1 and the supplying-end coil 16 sends the detection signal DET, the back-end circuits of the receiving-end module 2 are turned on immediately, such that the energies generated by the resonating coil are rapidly received by and stored in the capacitor 22. At this moment, a rush current may be generated on the path flowing electric power received by the receiver, and the energies sent from the supplying-end coil 16 are absorbed rapidly, which accelerates the attenuation speed of the coil signal C1, so as to reduce the time length of trigger signals generated by the signal receiver 120. In such a condition, as long as the receiving-end module 2 including a large capacitor approaches the supplying-end module 1, the processor 111 may wrongly determine that the intruding metal 3 exists; hence, the procedure of sending electric power may not be activated forever.

In order to solve the above problem, the present invention determines whether the object approaching the supplying-end module 1 is an accurate receiving-end module 2 by obtaining the resonant frequency, and the supplying-end module 1 forwards electric charges to the capacitor 22 by a pre-charging method when the receiving-end module 2 is recognized. After the capacitor 22 is fully charged, the capacitor 22 may not absorb energies from the detection signal DET, so that the processor 111 may successfully perform determination on the intruding metal 3.

Figure 6:
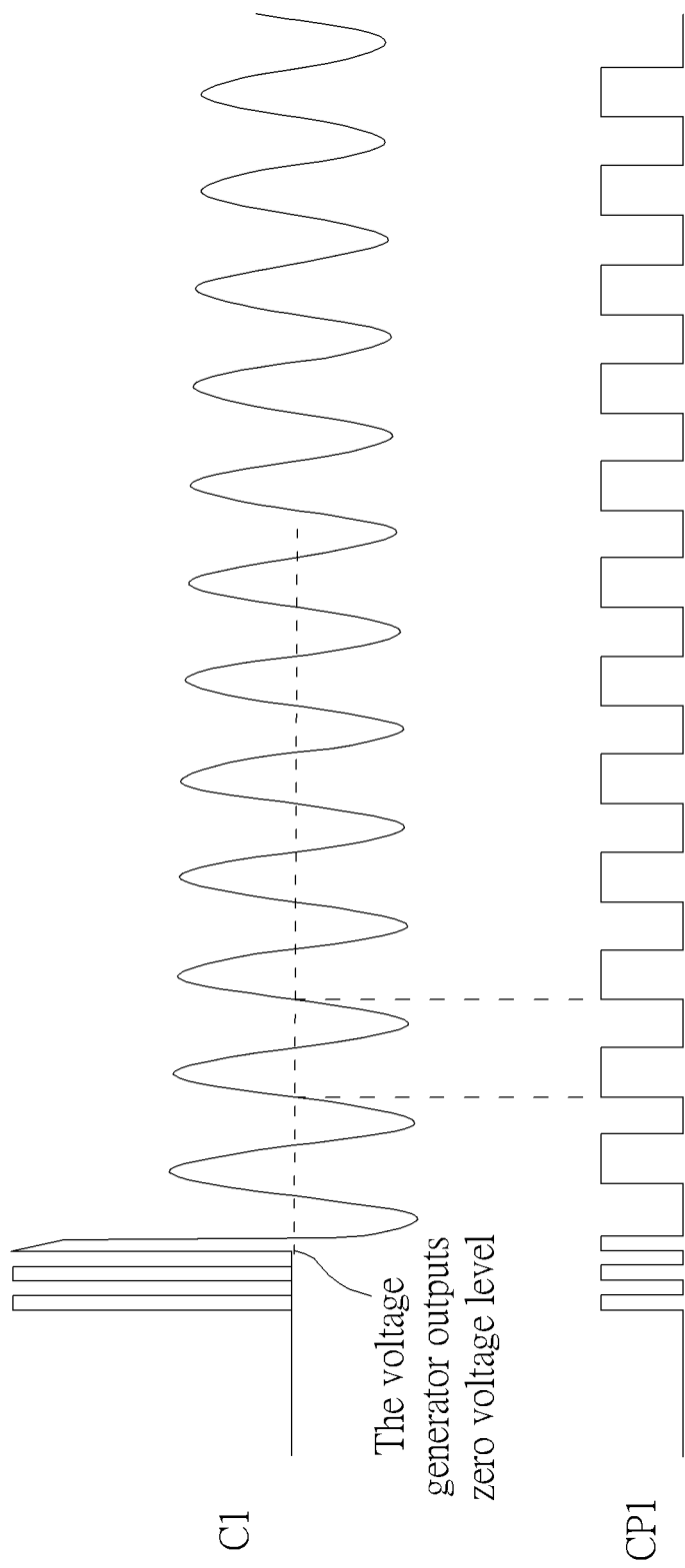
FIG. 6 is a schematic diagram of determining the resonant frequency of the coil signal according to an embodiment of the present invention.

Please refer to FIG. 6, which is a schematic diagram of determining the resonant frequency of the coil signal C1 according to an embodiment of the present invention. Consider the illustrations in FIG. 6 together with the signal receiver 120 shown in FIG. 1. Since the coil signal C1 oscillates up and down around the zero voltage level, the voltage generator 113 may output a zero voltage level to the comparator 114; hence, the comparator may output a clock signal, of which the frequency is equal to the resonant frequency of the coil signal C1. Alternatively, if the voltage generator 113 and the comparator 114 are configured to obtain the trigger signals corresponding to the peak values of the coil signal C1, another set of voltage generator and comparator may be included in the signal receiver 120 for obtaining the resonant frequency.

As mentioned above, the processor 111 may perform determination on the intruding metal 3 according to the entire time length of emergences of the first trigger signals T1, the second trigger signals T2 and the third trigger signals T3. If the time length is greater than the predefined time value, the processor 111 determines that there is no intruding metal 3 existing in the power supply range of the induction type power supply system 100. If the time length is smaller than the predefined time value, the coil signal C1 has a higher attenuation speed, which may be caused by the intruding metal 3 or by the capacitor 22 of the receiving-end module 2; hence, a further determination is necessary. In an embodiment, if the processor 111 determines that the time length is smaller than the predefined time value, the processor 111 may further determine the resonant frequency of the supplying-end coil 16. In general, the receiving-end module 2 usually includes a magnetic conductor 261. When the magnetic conductor 261 approaches the supplying-end module 1, it may reduce the self-resonant frequency of the supplying-end coil 16. In such a condition, the processor 111 may set a predefined frequency value in advance, and the predefined frequency value is compared with the detected resonant frequency of the coil. For example, the self-resonant frequency under the situation where the supplying-end coil 16 is not close to any external object (i.e., without a magnetic conductor) may be detected, and the self-resonant frequencies under the situations where the receiving-end module 2 and the supplying-end module 1 have different distances may be detected. The predefined frequency value may be set to be an optimal value between the above frequencies. Subsequently, after outputting the detection signal DET and obtaining the resonant frequency of the supplying-end coil 16, the processor 111 may further determine the magnitude of the resonant frequency of the supplying-end coil 16. The processor 111 determining that the resonant frequency is greater than the predefined frequency value means that the increasing attenuation speed of the coil signal C1 may be resulted from the intruding metal 3; hence, the processor 111 thereby determines that there is an intruding metal 3 existing in the power supply range of the induction type power supply system 100. The processor 111 determining that the resonant frequency is smaller than the predefined frequency value means that the magnetic conductor 261 of the receiving-end module 2 may be approaching the supplying end to reduce the resonant frequency; hence, the increasing attenuation speed of the coil signal C1 may be resulted from the capacitor 22 of the receiving-end module 2. In such a condition, the processor 111 may perform a pre-charging procedure to send electric power to charge the capacitor 22. After the electric charges stored in the capacitor 22 are enough, the capacitor 22 may not affect the attenuation speed of the coil signal C1, and the processor 111 thereby determines that the device approaching the supplying-end module 1 is the receiving-end module 2 rather than the intruding metal 3.

Figure 7:
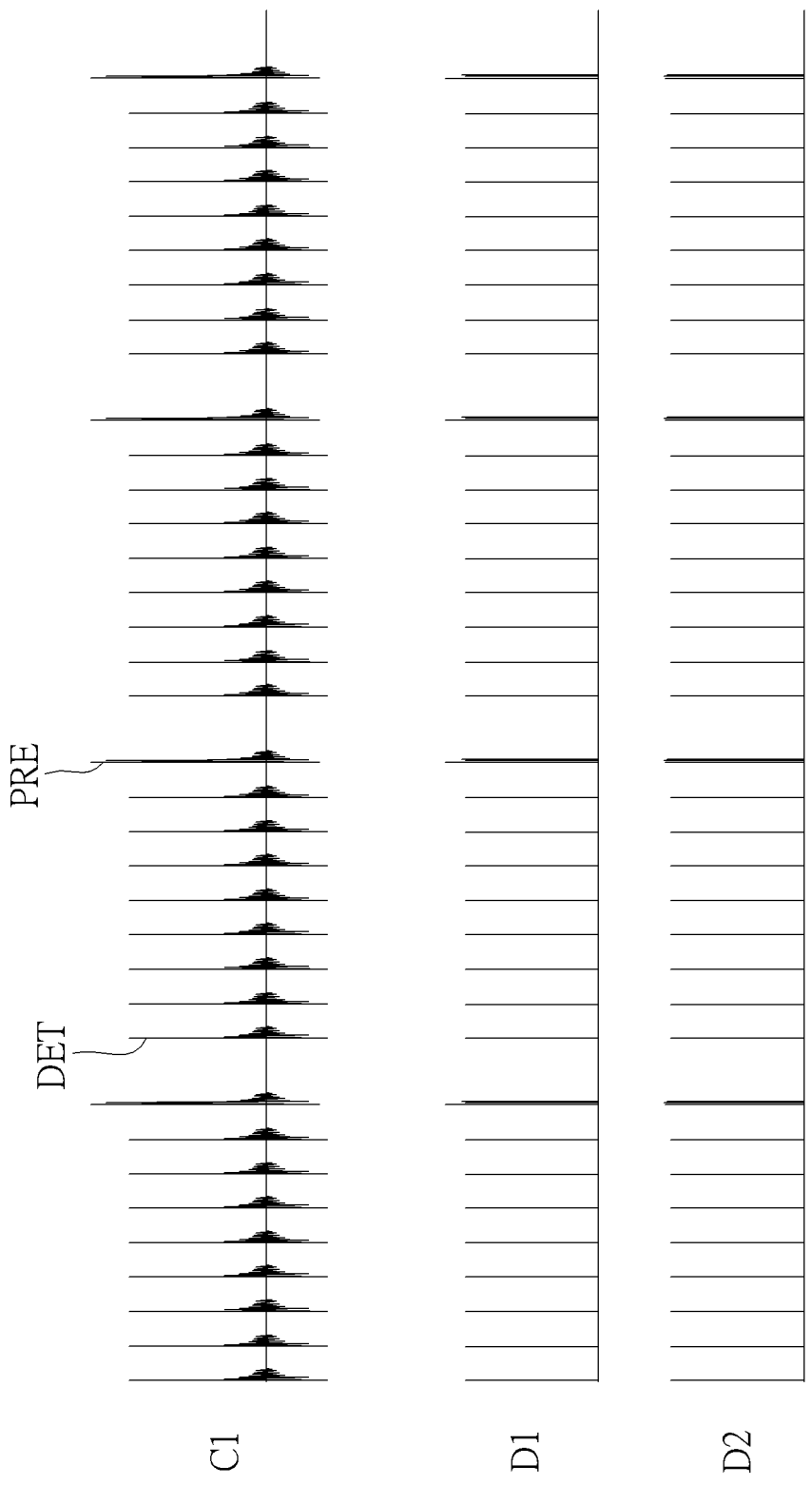
FIG. 7 is a schematic diagram of the detection signal and the pre-charging procedure according to an embodiment of the present invention.

Please refer to FIG. 7, which is a schematic diagram of the detection signal DET and the pre-charging procedure PRE according to an embodiment of the present invention. FIG. 7 illustrates the waveforms of the driving signals D1 and D2 and the coil signal C1. As shown in FIG. 7, the detection signal DET may be transmitted periodically, and the processor 111 may obtain the attenuation characteristics of the coil signal C1 in response to each detection signal DET, e.g., through the time length of the trigger signals and the resonant frequency mentioned above. When the processor 111 determines that the resonant frequency falls but the time length of the trigger signals indicates that the intruding metal 3 exists, there may be an accurate receiving-end module 2 approaching and its capacitor 22 does not store enough electric charges. Therefore, a pre-charging procedure PRE may be performed after several transmissions of the detection signal DET. In the pre-charging procedure PRE, the supplying-end module 1 sends electric power to charge the capacitor 22 in the receiving-end module 2, while the time length and energy delivery of sending the electric power are insufficient to activate the operation of the receiving-end module 2 responding with a data code. More specifically, the process of determining the intruding metal 3 is not accomplished when the pre-charging procedure PRE is performed; that is, the processor 111 has not determined whether the intruding metal 3 exists yet. Therefore, the pre-charging procedure PRE only sends a little electric power, so that the electric power may not be excessively large to activate the receiving-end module 2 to respond with a data code so as to activate the normal charging procedure. At this moment, if the intruding metal 3 exists, the intruding metal 3 may become overheated easily.

Therefore, the supplying-end module 1 may perform a pre-charging procedure PRE after transmitting the detection signal DET by several times, and then transmit the detection signal DET to determine the self-resonant frequency of the coil signal C1 and the time length of the trigger signals (i.e., by comparing the time length with the predefined time value). In this embodiment, the detection signal DET only includes two simultaneous switching of the driving signals D1 and D2 and one pulse signal P1, and the delivered energy is quite small. In comparison, one pre-charging procedure PRE always includes hundreds of switching of the driving signals D1 and D2, so that the capacitor 22 may be charged to enough electricity quantity within a limited time period.

In general, if there is an accurate receiving-end module 2 in the power supply range of the supplying-end module 1, the capacitor 22 may be charged to have enough electricity quantity after several times of pre-charging procedure PRE. At this moment, in the process of determining the intruding metal 3 with the detection signal DET, the processor 111 may determine that the time length of the trigger signals is greater than the predefined time value and also determine that the receiving-end module 2 is approaching based on the resonant frequency of the coil signal C1, so as to activate a normal charging procedure. In the normal charging procedure, the supplying-end module 1 outputs electric power for a longer time, allowing the receiving-end module 2 to respond with a data code to activate the supplying-end module 1 to perform the complete power transmission process.

Please note that, if the number of times the pre-charging procedure PRE is performed reaches a predefined number while the time length of the trigger signals is still determined to be smaller than the predefined time value, the processor 111 may determine that there is an intruding metal 3 existing in the power supply range of the induction type power supply system 100 or the induction type power supply system 100 may not operate normally (e.g., malfunctioned), where power delivery is not activated by the supplying-end module 1 in such a condition. In an embodiment, the intruding metal 3 together with the receiving-end module 2 may be approaching the supplying-end module 1 at the same time. After the supplying-end module 1 outputs the detection signal DET, the processor 111 may determine that the receiving-end module 2 is approaching based on the resonant frequency of the coil signal C1, and may also determine that the intruding metal 3 exists based on the time length of the trigger signals. Subsequently, the processor 111 performs a pre-charging procedure PRE and then outputs the detection signal DET for further determination. However, even if the capacitor 22 is fully charged in the pre-charging procedure PRE, the intruding metal 3 still absorbs energies and thereby causes the coil signal C1 to attenuate rapidly. Therefore, after the number of times the pre-charging procedure PRE is performed reaches the predefined number, the processor 111 may determine that the intruding metal 3 exists if the processor 111 still detects that the time length of the trigger signals is smaller than the predefined time value. At this moment, the processor 111 may stop sending the detection signal DET and may not activate the normal charging procedure. In other words, as long as existence or approaching of the receiving-end module 2 is detected (i.e., due to the determination that the resonant frequency of the coil signal C1 is lower than the predefined frequency value), the processor 111 may perform the pre-charging procedure PRE, no matter whether the intruding metal 3 exists. The intruding metal 3 is accurately determined using the time length of the trigger signals only if the capacitor in the receiving end is fully charged after several times of pre-charging procedures PRE. In addition, malfunction and damages of the receiving-end module 2 may also result in that the attenuation speed of the coil signal C1 is still excessively large after several times of pre-charging procedures. At this moment, the processor 111 may also stop sending the detection signal DET and may not activate the normal charging procedure.

Figure 8:
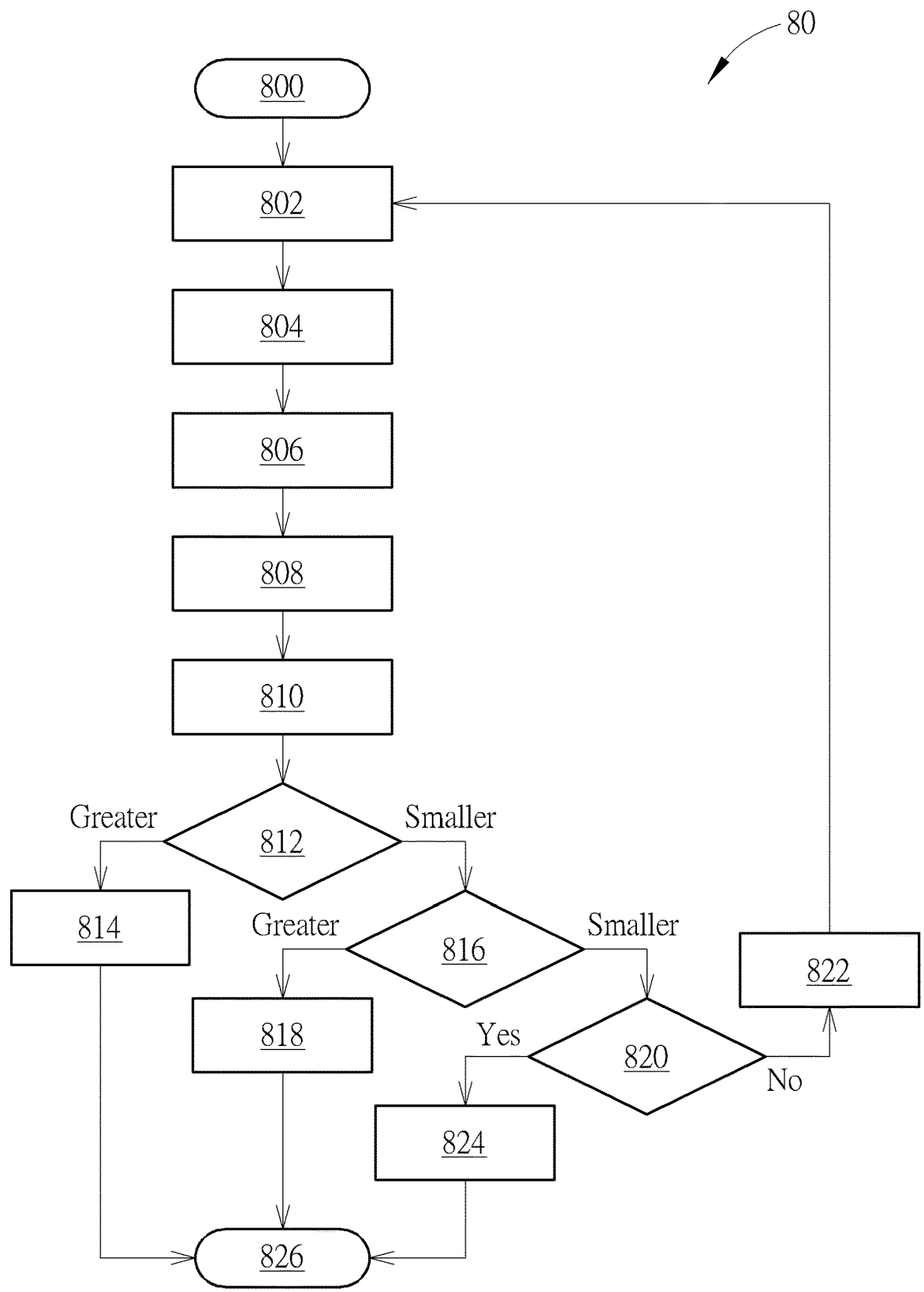
FIG. 8 is a schematic diagram of an intruding metal detection process according to an embodiment of the present invention.

The abovementioned method of determining an intruding metal performed by the supplying-end module may be summarized into an intruding metal detection process 80, as shown in FIG. 8. The intruding metal detection process 80, which may be used for a supplying end of an induction type power supply system such as the supplying-end module 1 shown in FIG. 1, includes the following steps:

Step 800: Start.

Step 802: Generate a detection signal DET on the driving signals D1 and D2, wherein the detection signal DET controls the supplying-end coil 16 to resonate and generate the coil signal C1.

Step 804: Obtain a reference voltage VC from the coil signal C1 when the detection signal DET is generated.

Step 806: Multiply the reference voltage VC by at least one ratio, respectively, to generate at least one threshold voltage.

Step 808: Compare a plurality of peak values of the coil signal C1 with the at least one threshold voltage, respectively, to generate a plurality of trigger signals.

Step 810: Calculate the time length of emergences of the plurality of trigger signals.

Step 812: Compare the time length with a predefined time value. If the time length is determined to be greater than the predefined time value, go to Step 814; if the time length is determined to be smaller than the predefined time value, go to Step 816.

Step 814: Determine that there is no intruding metal 3 existing in the power supply range of the induction type power supply system 100, and then the flow goes to Step 826.

Step 816: Compare the resonant frequency of the coil signal C1 with a predefined frequency value. If the resonant frequency is determined to be greater than the predefined frequency value, go to Step 818; if the resonant frequency is determined to be smaller than the predefined frequency value, go to Step 820.

Step 818: Determine that there is an intruding metal 3 existing in the power supply range of the induction type power supply system 100, and then the flow goes to Step 826.

Step 820: Determine whether the number of times the pre-charging procedure PRE is performed reaches a predefined number. If yes, go to Step 824; otherwise, go to Step 822.

Step 822: Perform a pre-charging procedure PRE, and then the flow returns to Step 802.

Step 824: Determine that there is an intruding metal 3 existing in the power supply range of the induction type power supply system 100 or the induction type power supply system 100 does not operate normally, and then the flow goes to Step 826.

Step 826: End.

The detailed operations and alternations of the intruding metal detection process 80 are described in the above paragraphs, and will be omitted herein.

To sum up, the present invention provides a method of determining an intruding metal before power delivery of an induction type power supply system starts. If the induction type power supply system determines that an intruding metal exists, the induction type power supply system may not activate power delivery, in order to prevent the intruding metal from receiving electromagnetic energies to result in dangerous of overheat. In the supplying-end module, the power driver may periodically send detection signals, allowing the supplying-end coil to resonate, and the coil signal may attenuate gradually. The processor may determine whether a receiving-end module is approaching according to the resonant frequency of the coil. The signal receiver may set at least one threshold voltage and compare the peak values of the coil signal with each threshold voltage to generate trigger signals in turn. The processor may determine the existence of the intruding metal according to the time length of emergences of the trigger signals. If the time length is greater than a predefined time value, the processor may determine that there is no intruding metal existing in the power supply range of the induction type power supply system and thereby activate the normal power delivery procedure. If the time length is smaller than the predefined time value, the attenuation speed of the coil signal may be accelerated due to the intruding metal or due to the capacitor of the receiving-end module. The supplying-end module further performs a pre-charging procedure to send electric power for the capacitor of the receiving-end module. After the electric charges stored in the capacitor are enough, the capacitor may not affect the attenuation speed of the coil signal, and the processor thereby determines that the device approaching the supplying-end module is the receiving-end module and activates the normal power delivery procedure. If the receiving-end module and an intruding metal approach the supplying-end module at the same time, the supplying-end module may still detect the approach of the receiving-end module based on the resonant frequency and perform the pre-charging procedure. However, after the number of times the pre-charging procedure is performed reaches a predefined number (i.e., the electric quantity stored in the capacitor of the receiving-end module is enough), the processor may still determine that the time length of emergences of the trigger signals is smaller than the predefined time value; hence, the processor may determine that an intruding metal exists or the induction type power supply system does not operate normally, and the supplying-end module will not activate the normal power delivery procedure. As a result, the present invention may perform determination on the intruding metal before power delivery of the induction type power supply system starts, and the supplying-end module is able to effectively determine the object approaching the supplying end is an accurate receiving-end module or an intruding metal. When the receiving-end module and the intruding metal approach the supplying-end module at the same time, the supplying-end module may also perform determination accurately.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An intruding metal detection method for a supplying-end module of an induction type power supply system, the supplying-end module comprising a supplying-end coil controlled by a first driving signal and a second driving signal, the intruding metal detection method comprising:
    periodically generating a detection signal on the first driving signal and the second driving signal, wherein the detection signal controls the supplying-end coil to resonate and generate a coil signal;
    setting at least one threshold voltage and comparing a plurality of peak values of the coil signal with the at least one threshold voltage, respectively, to generate a plurality of trigger signals;
    determining whether to perform a pre-charging procedure according to a resonant frequency of the coil signal; and
    determining whether there is an intruding metal existing in a power supply range of the induction type power supply system according to the plurality of trigger signals and the resonant frequency.

2. The intruding metal detection method of claim 1, wherein in the step of periodically generating the detection signal on the first driving signal and the second driving signal, each time generating the detection signal comprises:
    controlling the first driving signal and the second driving signal to be simultaneously switched between a first voltage level and a second voltage level by multiple times; and
    when the second driving signal is in the second voltage level after the first driving signal and the second driving signal are controlled to be simultaneously switched by multiple times, controlling only the first driving signal to be switched to the first voltage level and then return to the second voltage level to form a pulse signal, allowing the supplying-end coil to resonate according to the pulse signal.

3. The intruding metal detection method of claim 1, wherein the pre-charging procedure comprises:
    sending electric power to charge a capacitor in a receiving-end module of the induction type power supply system, wherein a time length and energy delivery of sending the electric power are insufficient to activate an operation of the receiving-end module responding with a data code.

4. The intruding metal detection method of claim 1, further comprising:
    determining whether a receiving-end module of the induction type power supply system is malfunctioned according to the plurality of trigger signals.

5. The intruding metal detection method of claim 1, wherein the step of setting the at least one threshold voltage comprises:
    obtaining a reference voltage from the coil signal when the detection signal is generated; and
    multiplying the reference voltage by at least one ratio, respectively, to generate the at least one threshold voltage.

6. The intruding metal detection method of claim 1, wherein the at least one threshold voltage comprises a plurality of threshold voltages, and the step of setting the at least one threshold voltage comprises:
    obtaining a reference voltage from the coil signal when the detection signal is generated; and
    multiplying the reference voltage by a first ratio, a second ratio and a third ratio, respectively, to generate a first threshold voltage, a second threshold voltage and a third threshold voltage among the plurality of threshold voltages, respectively.

7. The intruding metal detection method of claim 6, wherein the first ratio is one quarter, the second ratio is one eighth, and the third ratio is one sixteenth.

8. The intruding metal detection method of claim 6, wherein the step of comparing the plurality of peak values of the coil signal with the at least one threshold voltage, respectively, to generate the plurality of trigger signals comprises:
    comparing the plurality of peak values with the first threshold voltage to generate at least one first trigger signal among the plurality of trigger signals;
    comparing the plurality of peak values with the second threshold voltage to generate at least one second trigger signal among the plurality of trigger signals when the at least one first trigger signal stops emerging, wherein the second threshold voltage is smaller than the first threshold voltage; and
    comparing the plurality of peak values with the third threshold voltage to generate at least one third trigger signal among the plurality of trigger signals when the at least one second trigger signal stops emerging, wherein the third threshold voltage is smaller than the second threshold voltage.

9. The intruding metal detection method of claim 8, wherein the step of determining whether there is an intruding metal existing in the power supply range of the induction type power supply system according to the plurality of trigger signals comprises:
  calculating a time length of emergences of the at least one first trigger signal, the at least one second trigger signal and the at least one third trigger signal.

10. The intruding metal detection method of claim 9, wherein the steps of determining whether to perform the pre-charging procedure according to the resonant frequency of the coil signal and determining whether there is an intruding metal existing in the power supply range of the induction type power supply system according to the plurality of trigger signals and the resonant frequency comprise:
  comparing the time length with a predefined time value;
  determining that there is no intruding metal existing in the power supply range of the induction type power supply system when the time length is greater than the predefined time value; and
  further performing the following steps when the time length is smaller than the predefined time value:
    comparing the resonant frequency with a predefined frequency value;
    determining that there is an intruding metal existing in the power supply range of the induction type power supply system when the resonant frequency is greater than the predefined frequency value; and
    performing the pre-charging procedure and then comparing the time length with the predefined time value again when the resonant frequency is smaller than the predefined frequency value.

11. The intruding metal detection method of claim 10, further comprising:
  determining that there is an intruding metal existing in the power supply range of the induction type power supply system or the induction type power supply system does not operate normally after a number of times the pre-charging procedure is performed reaches a predefined number while the time length is still determined to be smaller than the predefined time value.

12. A supplying-end module for an induction type power supply system, for performing an intruding metal detection method, the supplying-end module comprising:
  a supplying-end coil;
  a power driver, coupled to the supplying-end coil, for outputting a first driving signal and a second driving signal to the supplying-end coil, and periodically generating a detection signal on the first driving signal and the second driving signal, wherein the detection signal controls the supplying-end coil to resonate and generate a coil signal;
  a signal receiver, coupled to the supplying-end coil, for setting at least one threshold voltage and comparing a plurality of peak values of the coil signal with the at least one threshold voltage, respectively, to generate a plurality of trigger signals; and
  a processor, coupled to the signal receiver, for performing the following steps:
    determining whether to perform a pre-charging procedure according to a resonant frequency of the coil signal; and
    determining whether there is an intruding metal existing in a power supply range of the induction type power supply system according to the plurality of trigger signals and the resonant frequency.

13. The supplying-end module of claim 12, wherein the power driver performs the following steps to generate the detection signal:
  controlling the first driving signal and the second driving signal to be simultaneously switched between a first voltage level and a second voltage level by multiple times; and
  when the second driving signal is in the second voltage level after the first driving signal and the second driving signal are controlled to be simultaneously switched by multiple times, controlling only the first driving signal to be switched to the first voltage level and then return to the second voltage level to form a pulse signal, allowing the supplying-end coil to resonate according to the pulse signal.

14. The supplying-end module of claim 12, wherein the pre-charging procedure comprises:
  sending electric power to charge a capacitor in a receiving-end module of the induction type power supply system, wherein a time length and energy delivery of sending the electric power are insufficient to activate an operation of the receiving-end module responding with a data code.

15. The supplying-end module of claim 12, wherein the processor further determines whether a receiving-end module of the induction type power supply system is malfunctioned according to the plurality of trigger signals.

16. The supplying-end module of claim 12, wherein the signal receiver performs the following steps to set the at least one threshold voltage:
  obtaining a reference voltage from the coil signal when the detection signal is generated; and
  multiplying the reference voltage by at least one ratio, respectively, to generate the at least one threshold voltage.

17. The supplying-end module of claim 12, wherein the at least one threshold voltage comprises a plurality of threshold voltages, and the signal receiver performs the following steps to set the plurality of threshold voltages:
  obtaining a reference voltage from the coil signal when the detection signal is generated; and
  multiplying the reference voltage by a first ratio, a second ratio and a third ratio, respectively, to generate a first threshold voltage, a second threshold voltage and a third threshold voltage among the plurality of threshold voltages, respectively.

18. The supplying-end module of claim 17, wherein the first ratio is one quarter, the second ratio is one eighth, and the third ratio is one sixteenth.

19. The supplying-end module of claim 17, wherein the signal receiver performs the following steps to compare the plurality of peak values of the coil signal with the at least one threshold voltage, respectively, to generate the plurality of trigger signals:
  comparing the plurality of peak values with the first threshold voltage to generate at least one first trigger signal among the plurality of trigger signals;
  comparing the plurality of peak values with the second threshold voltage to generate at least one second trigger signal among the plurality of trigger signals when the at least one first trigger signal stops emerging, wherein the second threshold voltage is smaller than the first threshold voltage; and comparing the plurality of peak values with the third threshold voltage to generate at least one third trigger signal among the plurality of trigger signals when the at least one second trigger signal stops emerging, wherein the third threshold voltage is smaller than the second threshold voltage.

20. The supplying-end module of claim 19, wherein the processor performs the following steps to determine whether there is an intruding metal existing in the power supply range of the induction type power supply system according to the plurality of trigger signals:

calculating a time length of emergences of the at least one first trigger signal, the at least one second trigger signal and the at least one third trigger signal.

21. The supplying-end module of claim 20, wherein the processor performs the following steps to determine whether to perform the pre-charging procedure according to the resonant frequency of the coil signal and determine whether there is an intruding metal existing in the power supply range of the induction type power supply system according to the plurality of trigger signals and the resonant frequency:

comparing the time length with a predefined time value;

determining that there is no intruding metal existing in the power supply range of the induction type power supply system when the time length is greater than the predefined time value; and further performing the following steps when the time length is smaller than the predefined time value:

comparing the resonant frequency with a predefined frequency value;

determining that there is an intruding metal existing in the power supply range of the induction type power supply system when the resonant frequency is greater than the predefined frequency value; and performing the pre-charging procedure and then comparing the time length with the predefined time value again when the resonant frequency is smaller than the predefined frequency value.

22. The supplying-end module of claim 21, wherein the processor determines that there is an intruding metal existing in the power supply range of the induction type power supply system or the induction type power supply system does not operate normally after a number of times the pre-charging procedure is performed reaches a predefined number while the time length is still determined to be smaller than the predefined time value.

\* \* \* \* \*